(12) United States Patent
In et al.

(10) Patent No.: US 12,087,212 B2
(45) Date of Patent: Sep. 10, 2024

(54) SCAN DRIVER FOR DRIVING PIXELS, A DISPLAY DEVICE INCLUDING THE SAME, AND METHOD FOR DRIVING PIXELS

(71) Applicant: SAMSUNG DISPLAY CO., LTD., Yongin-si (KR)

(72) Inventors: Hai Jung In, Yongin-si (KR); Sung Min Son, Yongin-si (KR); Jae Jin Song, Yongin-si (KR); Jung Woo Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 18/197,848

(22) Filed: May 16, 2023

(65) Prior Publication Data

US 2024/0062705 A1 Feb. 22, 2024

(30) Foreign Application Priority Data

Aug. 18, 2022 (KR) .................... 10-2022-0103577

(51) Int. Cl.
*G09G 3/32* (2016.01)

(52) U.S. Cl.
CPC ....... *G09G 3/32* (2013.01); *G09G 2300/0842* (2013.01); *G09G 2310/0267* (2013.01)

(58) Field of Classification Search
CPC .. G09G 3/3266; G09G 3/3688; G09G 3/3696; G09G 2310/0286; G09G 2310/0289; G09G 2310/0291; G09G 2310/08; G09G 3/32; G09G 2300/0842; G09G 2310/0267; G09G 3/3674; G09G 3/3233; G09G 2300/0819; G09G 2300/0861; G09G 2310/0262; G11C 19/28

See application file for complete search history.

(56) References Cited

U.S. PATENT DOCUMENTS

| | | | |
|---|---|---|---|
| 7,911,436 B2* | 3/2011 | Lee | G11C 19/184 377/64 |
| 9,418,755 B2* | 8/2016 | So | G09G 3/3677 |
| 9,990,897 B2* | 6/2018 | Pang | G09G 3/3677 |
| 10,311,795 B2* | 6/2019 | Chen | G11C 19/28 |
| 10,410,734 B2* | 9/2019 | Kim | G09G 3/20 |
| 10,453,386 B2 | 10/2019 | Jang | |
| 10,789,868 B2* | 9/2020 | Tian | G09G 3/20 |
| 10,943,552 B2* | 3/2021 | Kim | G09G 3/20 |

(Continued)

FOREIGN PATENT DOCUMENTS

KR 10-2021-0043773 4/2021

*Primary Examiner* — Michael J Jansen, II
(74) *Attorney, Agent, or Firm* — F. CHAU & ASSOCIATES, LLC

(57) ABSTRACT

A scan driver for driving a plurality of pixels, the scan driver including: stages connected to each other through carry lines, a first stage among the stages includes: a first scan circuit configured to generate a first scan signal in response to a stage select signal, and apply the first scan signal to pixels of the same row among the plurality of pixels; and a second scan circuit electrically connected to the first scan circuit to generate a carry signal overlapping the first scan signal, and configured to provide a second scan signal to the pixels of the same row in response to the carry signal, and the carry signal is output as the stage select signal to a second stage among the stages through one of the carry lines.

17 Claims, 10 Drawing Sheets

(56) References Cited

U.S. PATENT DOCUMENTS

| | | | |
|---|---|---|---|
| 11,107,381 B2* | 8/2021 | Wang | G09G 3/20 |
| 11,211,013 B2* | 12/2021 | Kim | G09G 3/3266 |
| 11,238,811 B2* | 2/2022 | Chung | G09G 3/20 |
| 11,244,629 B2 | 2/2022 | Cho et al. | |
| 11,348,534 B2* | 5/2022 | Feng | G09G 3/3266 |
| 11,574,591 B2* | 2/2023 | Lee | G09G 3/3275 |
| 11,651,730 B2* | 5/2023 | Lee | H10K 59/131 |
| | | | 345/214 |
| 11,749,206 B2* | 9/2023 | Kim | G09G 3/3233 |
| | | | 345/691 |
| 11,756,465 B2* | 9/2023 | Kim | G09G 3/3677 |
| | | | 345/690 |
| 11,823,615 B2* | 11/2023 | Lee | G09G 3/3266 |
| 11,830,408 B2* | 11/2023 | Feng | G09G 3/2092 |
| 11,862,106 B2* | 1/2024 | Kim | G09G 3/3233 |
| 11,869,406 B1* | 1/2024 | In | G09G 3/3674 |
| 11,893,943 B2* | 2/2024 | Chen | G09G 3/3266 |
| 11,922,886 B2* | 3/2024 | In | G09G 3/3233 |
| 2005/0275614 A1* | 12/2005 | Kim | G11C 19/184 |
| | | | 345/100 |
| 2007/0146289 A1* | 6/2007 | Lee | G11C 19/184 |
| | | | 345/100 |
| 2014/0152629 A1* | 6/2014 | So | G09G 3/3266 |
| | | | 377/64 |
| 2016/0358666 A1* | 12/2016 | Pang | G09G 3/3688 |
| 2018/0096733 A1* | 4/2018 | Kim | G09G 3/20 |
| 2018/0182300 A1* | 6/2018 | Chen | G09G 3/3266 |
| 2019/0206294 A1* | 7/2019 | Tian | G11C 19/28 |
| 2020/0258463 A1* | 8/2020 | Kim | G09G 3/3677 |
| 2021/0056910 A1* | 2/2021 | Chung | G11C 19/28 |
| 2021/0134203 A1* | 5/2021 | Wang | G09G 3/3266 |
| 2021/0201816 A1* | 7/2021 | Kim | G09G 3/3266 |
| 2021/0327363 A1* | 10/2021 | Feng | G11C 19/28 |
| 2022/0076609 A1* | 3/2022 | Feng | G09G 3/2092 |
| 2022/0084464 A1* | 3/2022 | Lee | H10K 59/131 |
| 2022/0108656 A1* | 4/2022 | Lee | G09G 3/3275 |
| 2022/0208059 A1* | 6/2022 | Kim | G09G 3/20 |
| 2022/0366836 A1* | 11/2022 | Lee | G11C 19/28 |
| 2023/0113452 A1* | 4/2023 | Kim | G09G 3/3266 |
| | | | 345/691 |
| 2023/0169926 A1* | 6/2023 | Kim | G09G 3/3266 |
| | | | 345/213 |
| 2023/0260462 A1* | 8/2023 | Chen | G11C 19/28 |
| | | | 345/214 |
| 2023/0351972 A1* | 11/2023 | In | G09G 3/3233 |

* cited by examiner

SCAN DRIVER FOR DRIVING PIXELS, A DISPLAY DEVICE INCLUDING THE SAME, AND METHOD FOR DRIVING PIXELS

CROSS-REFERENCE TO RELATED APPLICATION

The present application claims priority under 35 U.S.C. § 119(a) to Korean Patent Application No. 10-2022-0103577 filed on Aug. 18, 2022 in the Korean Intellectual Property Office, the disclosure of which is incorporated by reference herein in its entirety.

1. TECHNICAL FIELD

The present disclosure relates generally to an electronic device, and more particularly, to a scan driver for driving pixels, a display device including the same, and a method for driving pixels.

2. DISCUSSION OF THE RELATED ART

A display device is an output device for presentation of information in visual form. A display device generally includes a display panel including pixels, a scan driver for sequentially applying a scan signal to scan lines connected to rows of the pixels, and a data driver for applying data signals to data lines connected to columns of the pixels.

The scan driver may include stages for respectively driving the rows of the pixels. Each of the stages may apply the scan signal to a corresponding scan line in synchronization with one or more clock signals. The scan driver may perform, for each frame, operations of sequentially outputting the scan signal in each horizontal period from a first sage to a last stage.

SUMMARY

Embodiments of the present disclosure provide a scan driver for driving pixels with increased reliability, a display device including the scan driver, and a method for driving pixels.

In accordance with an embodiment of the present disclosure, there is provided a scan driver for driving a plurality of pixels, the scan driver including: stages connected to each other through carry lines, wherein a first stage among the stages includes: a first scan circuit configured to generate a first scan signal in response to a stage select signal, and apply the first scan signal to pixels of the same row among the plurality of pixels; and a second scan circuit electrically connected to the first scan circuit to generate a carry signal overlapping the first scan signal, and configured to provide a second scan signal to the pixels of the same row in response to the carry signal, and wherein the carry signal is output as the stage select signal to a second stage among the stages through one of the carry lines.

The first scan circuit and the second scan circuit are connected to each other through a first connection node, wherein the first scan circuit is configured to enable a voltage signal of the first connection node in response to the stage select signal, and to generate the first scan signal based on the enabled voltage signal of the first connection node, and the second scan circuit includes a carry signal generating circuit configured to generate the carry signal, based on the enable voltage signal of the first connection node.

The second scan circuit further includes an output circuit configured to generate the second scan signal by receiving the carry signal through a second connection node, the one of the carry lines is connected to the second stage, and the one of the carry lines is connected to the second connection node.

The second scan circuit generates the second scan signal by inverting the carry signal.

Each of the plurality of pixels includes a P-type transistor and an N-type transistor, the first scan signal is applied to P-type transistors of the pixels of the same row, and the second scan signal is applied to N-type transistors of the pixels of the same row.

In accordance with an embodiment of the present disclosure, there is provided a display device including: pixels; and a scan driver configured to drive the pixels, the scan driver includes stages respectively driving rows of the pixels, the stages being connected to each other through carry lines, an ith stage among the stages includes: a first scan circuit configured to generate a first scan signal in response to a stage select signal, and apply the first scan signal to pixels of a row corresponding to the ith stage; and a second scan circuit electrically connected to the first scan circuit to generate a carry signal overlapping the first scan signal, and configured to provide a second scan signal to the pixels of the row corresponding to the ith stage in response to the carry signal, the i is an integer greater than or equal to 1, and the carry signal is output as the stage select signal to an (i+1)th stage among the stages through one of the carry lines.

The display device further including a data driver configured to drive the pixels, each of the pixels includes: a first transistor to be turned on in response to the first scan signal to receive a data signal from the data driver; a storage capacitor to be charged by receiving the data signal through a first node; and a second transistor connected to the first node, the second transistor configured to be turned on in response to the second scan signal.

Each of the pixels further includes a third transistor configured to transfer the data signal received through the first transistor to a second node in response to a voltage of the first node, and the second transistor is connected between the first node and the second node, and is configured to be turned on in response to the second scan signal to transfer the data signal to the first node.

The first and third transistors include P-type transistors, and the second transistor includes an N-type transistor.

Each of the pixels further includes a light emitting diode electrically connected to the second node.

The display device further including a driving controller configured to control the scan driver, the stages include first to mth stages sequentially connected through the carry lines, and when the ith stage is the first stage, the ith stage is configured to receive a start signal as the stage select signal from the driving controller.

The display device further including a driving controller configured to control the scan driver, the driving controller is configured to generate first clock signals and second clock signals, and the first scan circuit is configured to be operated in response to at least one of the first clock signals, and the second scan circuit is configured to be operated in response to at least one of the second clock signals.

The first scan circuit and the second scan circuit are connected to each other through a first connection node, the first scan circuit is configured to enable a voltage signal of the first connection node in response to the stage select signal, and to generate the first scan signal, based on the enabled voltage signal of the first connection node, and the second scan circuit includes a carry signal generating circuit configured to generate the carry signal, based on the enabled voltage signal of the first connection node.

The second scan circuit further includes an output circuit configured to generate the second scan signal by receiving the carry signal through a second connection node, and the one of the carry lines is connected between the (i+1)th stage and the second connection node.

The second scan circuit generates the second scan signal by inverting the carry signal.

In accordance with an embodiment of the present disclosure, there is provided a method for driving a plurality of pixels, rows of the plurality of pixels are respectively connected to stages, and the stages are connected to each other, and the method includes: in any one of the stages, receiving a stage select signal; generating a first scan signal in response to the stage select signal and applying the first scan signal to pixels of the same row among the plurality of pixels; generating a carry signal overlapping the first scan signal; generating a second scan signal in response to the carry signal and applying the second scan signal to the pixels of the same row; and providing the carry signal as the stage select signal to another of the stages.

The applying of the first scan signal includes: generating an enabled voltage signal at an internal node in response to the stage select signal; and generating a first scan signal, based on the enabled voltage signal, and the generating of the carry signal includes generating the carry signal, based on the enabled voltage signal.

The applying of the second scan signal includes generating the second scan signal by inverting the carry signal.

In accordance with an embodiment of the present disclosure, there is provided a scan driver for driving a plurality of pixels, the scan driver including: a first scan circuit configured to generate a first scan signal in response to a stage select signal; and a second scan circuit connected to the first scan circuit and configured to generate a carry signal and generate a second scan signal in response to the carry signal, wherein the carry signal is output to a next stage from a node located at an input of an output part of the second scan circuit.

The first scan signal and the carry signal overlap.

BRIEF DESCRIPTION OF THE DRAWINGS

Example embodiments of the present disclosure will now be described more fully hereinafter with reference to the accompanying drawings; however, the examples may be embodied in different forms and should not be construed as limited to the embodiments set forth herein.

In the drawing figures, dimensions may be exaggerated for clarity of illustration. Like reference numerals may refer to like elements throughout this disclosure.

DETAILED DESCRIPTION OF THE EMBODIMENTS

It will be understood that, although the terms "first," "second," etc. may be used herein to describe various elements, these elements should not be limited by these terms. These terms are used to distinguish one element from another element. Thus, a "first" element discussed below could also be termed a "second" element. As used herein, the singular forms are intended to include the plural forms as well, unless the context clearly indicates otherwise.

It will be further understood that the terms "includes" and/or "including," when used in this specification, specify the presence of stated features, integers, steps, operations, elements, and/or components, but do not preclude the presence and/or addition of one or more other features, integers, steps, operations, elements, components, and/or groups thereof.

The effects and characteristics of the present disclosure and a method of achieving the effects and characteristics will be clear by referring to the embodiments described below in detail together with the accompanying drawings. However, the present disclosure is not limited to the embodiments disclosed herein but may be implemented in various forms. In the entire specification, when an element is referred to as being "connected" or "coupled" to another element, it can be directly connected or coupled to the another element or be indirectly connected or coupled to the another element with one or more intervening elements interposed therebetween. In an embodiment of the present disclosure, the term "connection" between two components may include both electrical connection and physical connection.

Figure 1:
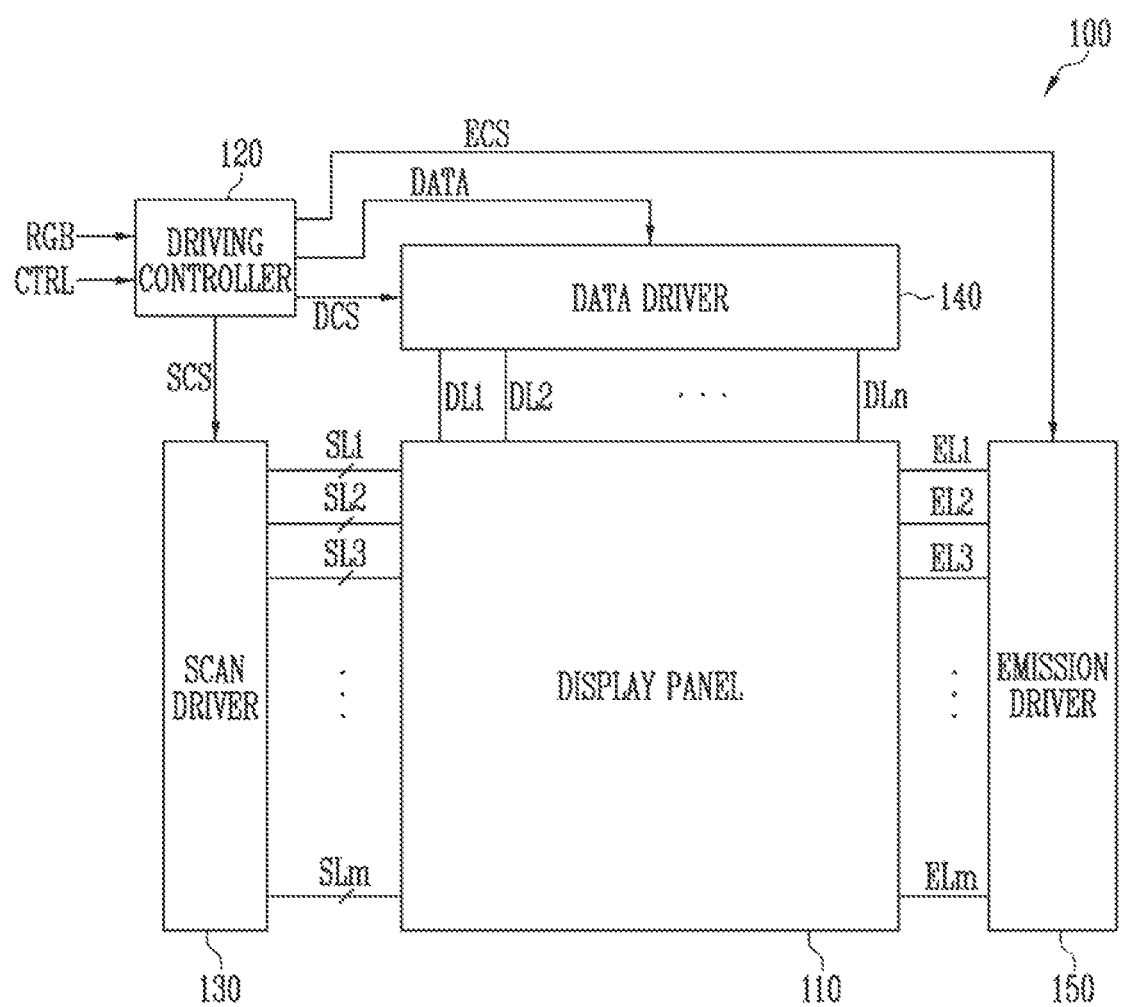
FIG. 1 is a block diagram illustrating a display device in accordance with an embodiment of the present disclosure.

FIG. 1 is a block diagram illustrating a display device in accordance with an embodiment of the present disclosure.

Referring to FIG. 1, the display device 100 may include a display panel 110, a driving controller 120, a scan driver 130, a data driver 140, and an emission driver 150.

The display panel 110 includes pixels. Rows of the pixels are connected to the scan driver 130 through first to mth scan lines SL1 to SLm, and columns of the pixels are connected to the data driver 140 through first to nth data lines DL1 to DLn.

The display panel 110 may be at least one of various display panels including a light emitting diode (LED) panel, a liquid crystal display (LCD) panel, an electrophoretic display panel, an electrowetting display panel, and the like. Hereinafter, it is described that the display panel 110 is a light emitting diode panel, and the pixels include light emitting diodes. However, embodiments of the present disclosure are not limited thereto, and the display panel 110 may be another type of display panel.

The driving controller 120 may receive an image signal RGB and a control signal CTRL from the outside. The driving controller 120 generates an image data signal DATA by converting a data format of the image signal RGB to be suitable for an interface with the data driver 140. The driving controller 120 outputs a scan control signal SCS, a data control signal DCS, and an emission control signal ECS, based on the control signal CTRL.

The scan driver 130 may be disposed adjacent to the display panel 110. The scan driver 130 may be connected to the rows of the pixels of the display panel 110 through the first to mth scan lines SL1 to SLm. The scan driver 130 may sequentially apply a scan signal to each of the first to mth scan lines SL1 to SLm in response to the scan control signal SCS.

Each of the first to mth scan lines SL1 to SLm may include two or more signal lines, and the signal lines may be connected to pixels of the same row. The scan signal may include two or more signals. This will be described in more detail with reference to FIG. 3.

The data driver 140 receives the data control signal DCS and the image data signal DATA from the driving controller 120. The data driver 140 converts the image data signal DATA into data signals, and outputs the data signals to the first to nth data lines DL1 to DLn. The data signals are analog voltages corresponding to grayscale values according to the image data signal DATA. Accordingly, the data signals can be written or provided to pixels of a row, which receive the scan signal from the scan driver 130.

The emission driver 150 is operated in response to the emission control signal ECS from the driving controller 120. The emission driver 150 may output emission control signals to emission control lines EL1 to Elm. The pixels of the display panel 110 may emit light in response to an emission control signal of a corresponding emission control line, in a state in which data signals are written.

Figure 2:
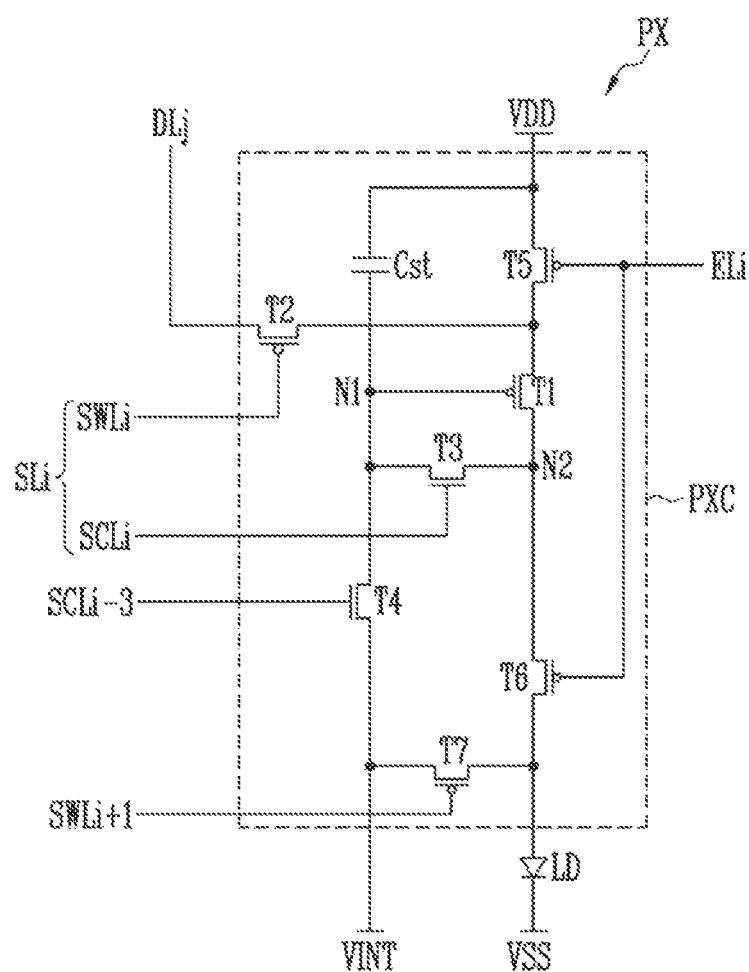
FIG. 2 is a circuit diagram illustrating an embodiment of any one of pixels of a display panel shown in FIG. 1.

FIG. 2 is a circuit diagram illustrating an embodiment of any one of the pixels of the display panel shown in FIG. 1.

Referring to FIG. 2, a pixel PX connected to an ith scan line SLi among the first to mth scan lines SL1 to SLm shown in FIG. 1 and a jth data line DLj among the first to mth data lines DL1 to DLn shown in FIG. 1 is illustrated (here, i is an integer which is greater than 1 and is smaller than or equal to m, and j is an integer is greater than 1 and is smaller than or equal to n).

The pixel PX includes a light emitting diode LD and a pixel circuit for controlling the same. Pixel circuit PXC includes first to seventh transistors T1, T2, T3, T4, T5, T6, and T7 and at least one capacitor Cst. Each of the first to seventh transistors T1 to T7 may be a transistor having a low-temperature polycrystalline silicon (LTPS) semiconductor layer.

Some of the first to seventh transistors T1 to T7 may be P-type transistors, and the others of the first to seventh transistors T1 to T7 may be N-type transistors. The first, second, and fifth to seventh transistors T1, T2, and T5 to T7 may be P-type transistors, and the third and fourth transistors T3 and T4 may be N-type transistors using an oxide semiconductor as a semiconductor layer. For example, the first, second, and fifth to seventh transistors T1, T2, and T5 to T7 may be p-type metal oxide semiconductor (PMOS) transistors, and the third and fourth transistors T3 and T4 may be n-type metal oxide semiconductor (NMOS) transistors. However, embodiments are not limited to the pixel circuit PXC shown in FIG. 2. For example, the first to seventh transistors T1 to T7 may all be P-type transistors or N-type transistors.

The ith scan line SLi may include two signal lines which may be provided as an ith write scan line SWLi and an ith compensation scan line SCLi. Two scan signals are provided through these signal lines. For example, a first scan signal may be provided through the ith write scan line SWLi and a second scan signal may be provided through the ith compensation scan line SCLi.

The pixel circuit PXC may be further connected to a scan line of another row. In some embodiments, the pixel circuit PXC may be further connected to a write scan line of a next row, e.g., an (i+1)th write scan line SWLi+1 as shown in FIG. 2. In some embodiments, the pixel circuit PXC may be further connected to a compensation scan line of a previous row, e.g., an (i−3)th compensation scan line SCLi−3 as shown in FIG. 2.

The first transistor T1 includes a first electrode connected to a first driving voltage VDD via the fifth transistor T5, a second electrode connected to a second node N2, and a gate electrode connected to a first node N1. The first transistor T1 may receive a data signal transferred through the jth data line DLj to supply, to the light emitting diode LD, a driving current flowing from the first driving voltage VDD to a second driving voltage VSS.

The second transistor T2 includes a first electrode connected to the jth data line DLj, a second electrode connected to the first electrode of the first transistor T1, and a gate electrode connected to the ith write scan line SWLi. The second transistor T2 may be turned on according to a write scan signal of the ith write scan line SWLi, to transfer the data signal transferred through the jth data line DLj to the first electrode of the first transistor T1.

The third transistor T3 includes a first electrode connected to the first node N1, a second electrode connected to the second node N2, and a gate electrode connected to the ith compensation scan line SCLi. In other words, the third transistor T3 may be connected to the first and second electrodes of the first transistor T1. The third transistor T3 may be turned on according to a compensation scan signal received through the ith compensation scan line SCLi, to connect the gate electrode and the second electrode of the first transistor T1 to each other, thereby allowing the first transistor T1 to be diode-connected.

The fourth transistor T4 includes a first electrode connected to the first node N1, a second electrode connected to an initialization voltage VINT, and a gate electrode connected to the (i−3)th compensation scan line SCLi−3. The fourth transistor T4 may be turned on according to a compensation scan signal received through the (i−3)th compensation scan line SCLi−3, to transfer the initialization voltage VINT to the first node N1 or one end of the capacitor Cst, thereby initializing the first node N1 or the one end of the capacitor Cst.

The fifth transistor T5 includes a first electrode connected to the first driving voltage VDD, a second electrode connected to the first electrode of the first transistor T1, and a gate electrode connected to an ith emission control line ELi. The sixth transistor T6 includes a first electrode connected to the second node N2, a second electrode connected to an anode electrode of the light emitting element LD, and a gate electrode connected to the ith emission control line ELi. The fifth transistor T5 and the sixth transistor T6 are turned on according to an emission control signal received through the ith emission control line ELi.

The seventh transistor T7 includes a first electrode connected to the second electrode of the fourth transistor T4, a second electrode connected to the second electrode of the sixth transistor T6 (and the anode electrode of the light emitting diode LD), and a gate electrode connected to the (i+1)th write scan line SWLi+1. The seventh transistor T7 may be turned on according to a write scan signal received through the (i+1)th write scan line SWLi+1, to transfer the initialization voltage VINT to the anode electrode of the light emitting diode LD, thereby initializing the anode electrode of the light emitting diode LD.

The one end (e.g., first end) of the capacitor Cst is connected to the first node N1, and the other end (e.g., second end) of the capacitor Cst is connected to the first driving voltage VDD. A cathode electrode of the light emitting diode LD may be connected to the second driving voltage VSS.

When the compensation scan signal having logic level "high" (hereinafter, a high level) is provided through the (i–3)th compensation scan line SCLi–3, the fourth transistor T4 is turned on. The initialization voltage VINT is transferred to the first node N1 through the turned-on fourth transistor T4, and a voltage of the first node N1 is initialized by the initialization voltage VINT.

Next, when the compensation scan signal having the high level is supplied through the ith compensation scan line SCLi, the third transistor T3 is turned on. The first transistor T1 is diode-connected by the turned-on third transistor T3. In addition, the second transistor T2 is turned on by the write scan signal having logic level "low" (hereinafter, a low level) supplied through the ith write scan line SWLi. Then, a compensation voltage obtained by subtracting a threshold voltage of the first transistor T1 from the data signal supplied from the jth data line DLj is applied to the gate electrode of the first transistor T1.

The first driving voltage VDD and the compensation voltage may be applied to both ends of the capacitor Cst, and a voltage corresponding to a difference between voltages at both ends of the capacitor Cst may be written (or stored).

The emission control signal supplied through the ith emission control line ELi is changed from the high level to the low level. The fifth transistor T5 and the sixth transistor T6 are turned on in response to the emission control signal having the low level. Then, a driving current is generated according to a voltage difference between a voltage of the gate electrode of the first transistor T1 and the first driving voltage VDD. The driving current is supplied to the light emitting diode LD through the sixth transistor T6, so that the light emitting diode LD can emit light.

Figure 3:
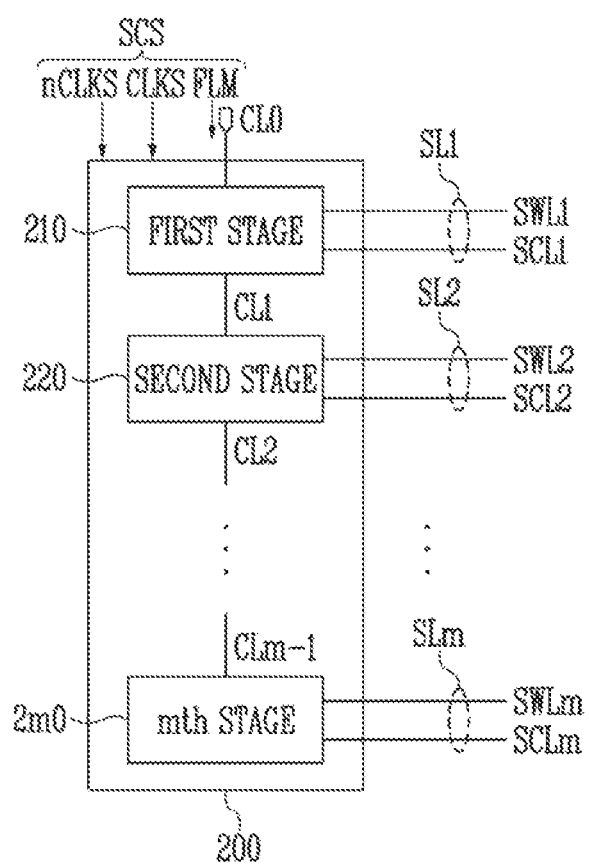
FIG. 3 is a block diagram illustrating an embodiment of a scan driver shown in FIG. 1.

FIG. 3 is a block diagram illustrating an embodiment of the scan driver shown in FIG. 1.

Referring to FIG. 3, a scan driver 200 may receive clock signals CLKS, inverted clock signals nCLKS, and a start signal FLM from the driving controller 120 shown in FIG. 1. The clock signals CLKS, the inverted clock signals nCLKS, and the start signal FLM are included in the scan control signal SCS shown in FIG. 1.

The scan driver 200 may include first to mth stages 210 to 2m0 which respectively drive first to mth rows of the pixels. In FIG. 3, the first stage 210 may be connected to a first write scan line SWL1 and a first compensation scan line SCL1 to drive pixels of the first row. The first write scan line SWL1 and the first compensation scan line SCL1 are included in the first scan line SL1 shown in FIG. 1. The second stage 220 may be connected to a second write scan line SWL2 and a second compensation scan line SCL2 to drive pixels of the second row. The second write scan line SWL2 and the second compensation scan line SCL2 are included in the second scan line SL2 shown in FIG. 1. The mth stage 2m0 may be connected to an mth write scan line SWLm and an mth compensation scan line SCLm to drive pixels of the mth row. The mth write scan line SWLm and the mth compensation scan line SCLm are included in the mth scan line SLm shown in FIG. 1.

Each of the first to mth stages 210 to 2m0 may receive at least one of the clock signals CLKS and at least one of the inverted clock signals nCLKS, and be operated in response to (or in synchronization with) the received clock signal and the received inverted clock signal.

The first to mth stages 210 to 2m0 may be sequentially connected through carry lines CL0 to CLm–1 to form a string. Each stage of the first to mth stages 210 to 2m0 may receive a stage select signal, apply a write scan signal and a compensation scan signal to a write scan line and a compensation scan line in response to the stage select signal, and transfer a carry signal as a stage select signal to a next stage through a carry line. For example, the first stage 210 may receive the start signal FLM transmitted through a zeroth carry line CL0 as a stage select signal, apply scan signals to the first write scan line SWL1 and the first compensation scan line SCL in response to the start signal FLM, and transmit a carry signal to the second stage 220 through a first carry line CL1. The second stage 220 may receive the carry signal transmitted through the first carry line CL1 as a stage select signal, apply scan signals to the second write scan line SWL2 and the second compensation scan line SCL2 in response to the carry signal, and transfer a carry signal through a second carry line CL2. The mth state 2m0 may receive a carry signal transmitted through an (m–1)th carry line CLm–1 as a stage select signal, and apply scan signals to the mth write scan line SWLm and the mth compensation scan line SCLm in response to the carry signal. The mth stage 2m0 may not transfer a carry signal through a carry line.

Figure 4:
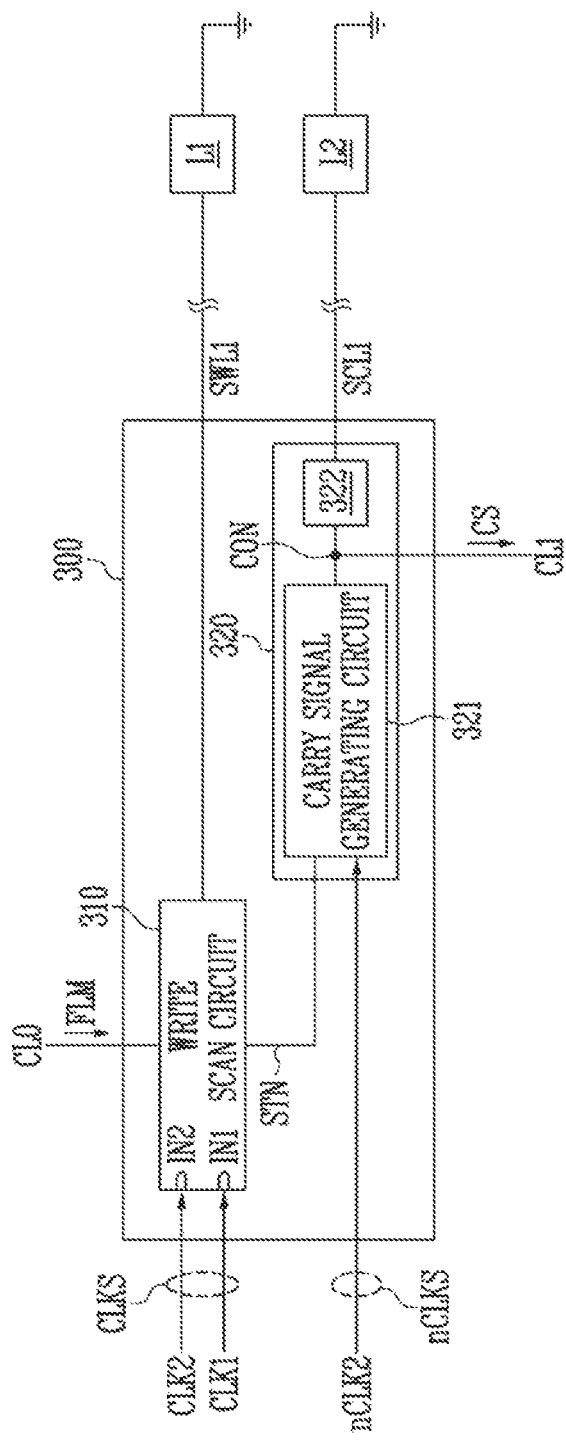
FIG. 4 is a block diagram illustrating an embodiment of any one stage among first to mth stages shown in FIG. 3.

FIG. 4 is a block diagram illustrating an embodiment of any one stage among the first to mth stages shown in FIG. 3.

Referring to FIG. 4, a stage 300 may include a write scan circuit 310 and a compensation scan circuit 320.

A first scan circuit, which may be provided in the form of the write scan circuit 310, may generate a scan signal (e.g., a write scan signal) according to a stage select signal. A second scan circuit, which may be provided in the form of the compensation scan circuit 320, may be electrically connected to the write scan circuit 310 through a stage select node STN, generate a carry signal temporally overlapping with the scan signal, and generate another scan signal (e.g., a compensation scan signal) according to the carry signal.

Hereinafter, for convenience of description, it is assumed that the stage 300 is the first stage 210 shown in FIG. 3. However, this is merely illustrative, and it is understood that the stage 300 may be applied identically to the second to mth stages 220 to 2m0 shown in FIG. 3 when carry lines (e.g., CL0 and CL1) connected to the stage 300 are changed to be suitable for the scan driver 200 shown in FIG. 3. It is understood that clock signals (e.g., CLK1 and CLK2) and inverted clock signals (e.g., nCLKS), which are received at the stage 300, may be variously changed in some embodiments.

The write scan circuit 310 may receive first and second clock signals CLK1 and CLK2 respectively through first and second input terminals IN1 and IN2. The first and second clock signals CLK1 and CLK2 may be included in clock signals CLKS shown in FIG. 3.

The write scan circuit 310 may receive a start signal FLM through a zeroth carry line CL0. The write scan circuit 310 may enable a voltage signal of the stage select node STN according to the start signal FLM, and generate a write scan signal, based on the enabled voltage signal, thereby outputting the write scan signal to a first write scan line SWL1. The write scan circuit 310 may perform such operations in synchronization with the first and second clock signals CLK1 and CLK2. The stage select node STN may be provided as a connection node at which the write scan circuit 310 and the compensation scan circuit 320 are connected to each other.

The compensation scan circuit 320 may receive a second inverted clock signal nCLK2. In some embodiments, an xth inverted clock signal nCLKx may be a signal obtained by inverting an (x−1)th clock signal CLKx−1. The second inverted clock signal nCLK2 may be included in the inverted clock signals nCLKS shown in FIG. 3. As described above, the inverted clock signals nCLKS shown in FIG. 3 may be signals associated with the clock signals CLKS shown in FIG. 3.

The compensation scan circuit 320 may be electrically connected to the write scan circuit 310 to generate a carry signal overlapping with the write scan signal applied to the first write scan line SWL1. In addition, the compensation scan circuit 320 may generate a compensation scan signal according to the carry signal and output the compensation scan signal to a first compensation scan line SCL1.

More specifically, the compensation scan circuit 320 may include a carry signal generating circuit 321 and an output circuit 322. The carry signal generating circuit 321 may be connected to the stage select node STN, and output a carry signal CS to a carry signal output node CON according to the enabled voltage signal of the stage select node STN. The carry signal generating circuit 321 may perform such operations in synchronization with the second inverted clock signal nCLK2.

The output circuit 322 is connected to the carry signal generating circuit 321 through the carry signal output node CON to receive the carry signal CS. The output circuit 322 may generate a compensation scan signal according to the carry signal CS of the carry signal output node CON and output the compensation scan signal to the first compensation scan line SCL1. In some embodiments, the output circuit 322 may include an inverter circuit for generating a compensation scan signal by inverting the carry signal CS.

A first carry line CL1 may branch off at the carry signal output node CON between the carry signal generating circuit 321 and the output circuit 322 to be connected to a write scan circuit 310 of a next stage. Accordingly, the carry signal CS may be transferred to the next stage (e.g., the second stage 220 shown in FIG. 3).

The first write scan line SWL1 may be connected to gates of second transistors (see T2 shown in FIG. 2) of pixel circuits arranged on a corresponding pixel row of the display panel 110 (see FIG. 1) as described with reference to FIG. 2. In FIG. 4, a load corresponding to the second transistor of the corresponding pixel circuits is illustrated as a first load (or capacitance) L1. It may be understood that the first load L1 is connected between the first write scan line SWL1 and a ground node.

The first compensation scan line SCL1 is connected to gates of third transistors (see T3 shown in FIG. 2) of the same pixel circuits of the display panel 110 as described with reference to FIG. 2. In FIG. 4, a load corresponding to the third transistors of the corresponding pixel circuits is illustrated as a second load (or capacitance) L2. It may be understood that the second load L2 is connected between the first compensation scan line SCL1 and the ground node.

The carry signal CS may be required to overlap with the write scan signal. If a carry line branches off at the first write scan line SWL1 to be connected to a next stage, a corresponding carry signal may be influenced by the first load L1 connected to the first write scan line SWL1. For example, a falling time at which the corresponding carry signal is changed from the high level to the low level and a rising time at which the corresponding carry signal is changed from the low level to the high level may increase due to the first load L1, and therefore, the increase in the falling and rising times may deteriorate the reliability of the corresponding carry signal. The deterioration of the reliability of the carry signal may deteriorate the operational reliability of the scan driver.

In accordance with an embodiment of the present disclosure, the compensation scan circuit 320 may include the carry signal generating circuit 321 and the output circuit 322. The first carry line CL1 may branch off at the carry signal output node CON between the carry signal generating circuit 321 and the output circuit 322 to be connected to a next stage. For example, the first carry line CL1 does not branch off from the first write scan line SWL1 or the first compensation scan line SCL1. In other words the first carry line CL1 is not connected to the first write scan line SWL1 or the first compensation scan line SCL1. Accordingly, the carry signal of the first carry line CL1 can be stably output to the next stage while not being influenced by loads corresponding to corresponding pixel circuits, e.g., the first load L1 and the second load L2. For example, the carry signal CS may have a relatively short transition time. In other words, the carry signal CS may have relatively short rising and falling times. Thus, the carry signal CS can have increased reliability, and accordingly, the scan driver 200 (see FIG. 3) can have increased operational reliability.

Figure 5:
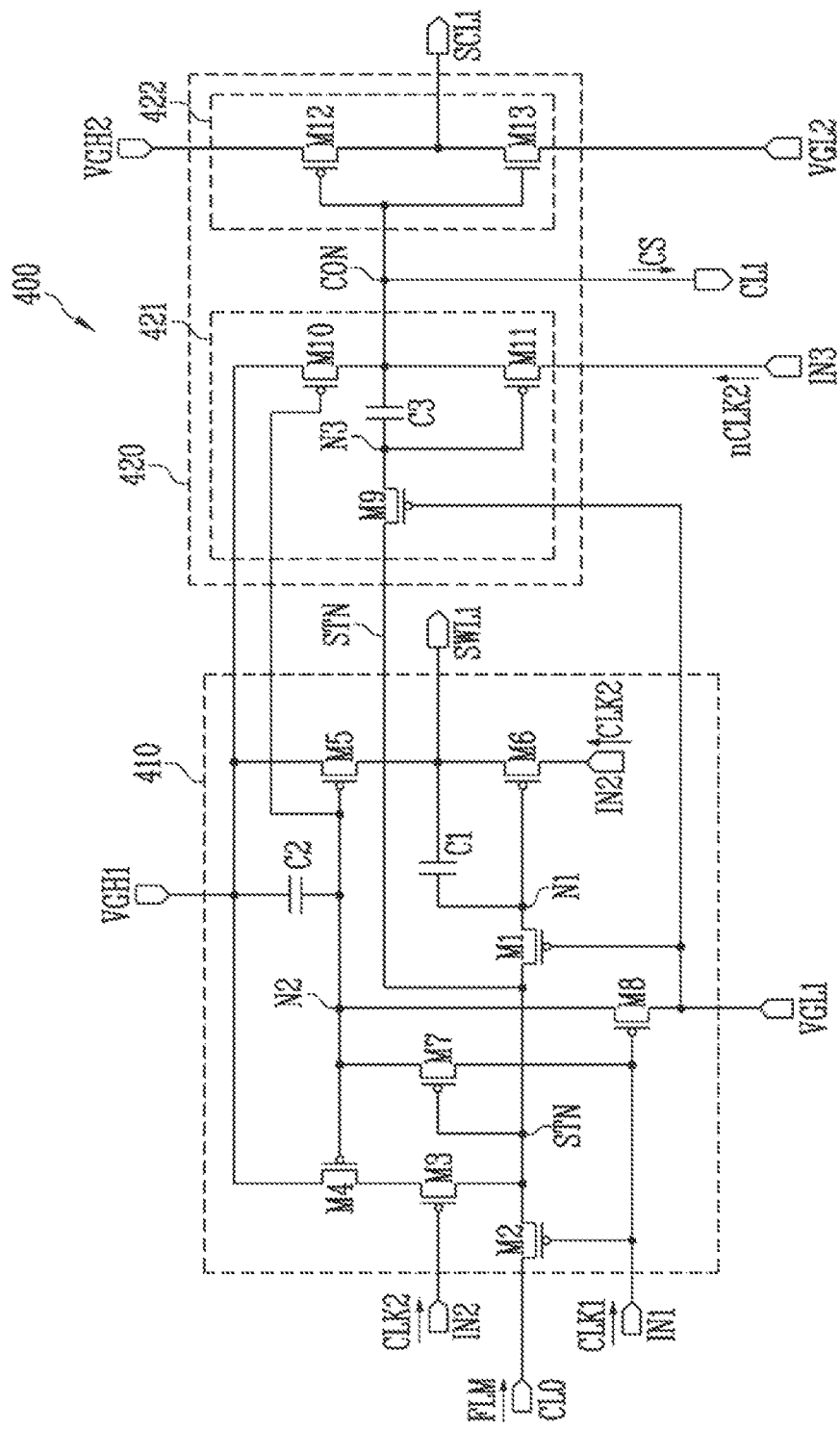
FIG. 5 is a circuit diagram illustrating an embodiment of the stage shown in FIG. 4.

FIG. 5 is a circuit diagram illustrating an embodiment of the stage shown in FIG. 4.

Referring to FIG. 5, a stage 400 may include a write scan circuit 410 and a compensation scan circuit 420.

The write scan circuit 410 may enable a voltage signal of a stage select node STN according to a start signal FLM of a zeroth carry line CL0, and output a write scan signal to a first write scan line SWL1, based on the enabled voltage signal of the stage select node STN. To accomplish this, the write scan circuit 410 may include first to eighth transistors M1 to M8 and first and second capacitors C1 and C2.

The first transistor M1 is connected between a first node N1 and the stage select node STN, and has a gate electrode connected to a first reference voltage VGL1. The first reference voltage VGL1 may be a gate-on voltage, e.g., a voltage having a low level. The first transistor M1 may maintain a turn-on state by the first reference voltage VGL1, thereby electrically connecting the first node N1 and the stage select node STN to each other. The first transistor M1 may limit the width of voltage drop of the stage select node STN according to a voltage of the first node N1. For example, although the voltage of the first node N1 drops to a voltage lower than the first reference voltage VGL1, a voltage of the stage select node STN does not go lower than a voltage obtained by subtracting a threshold voltage of the first transistor M1 from the first reference voltage VGL1.

The fifth transistor M5 is connected between a first power voltage VGH1 and the first write scan line SWL1, and has a gate electrode connected to a second node N2. The fifth transistor M5 may electrically connect the first power voltage VGH1 and the first write scan line SWL1 to each other according to a voltage of the second node N2. The first power voltage VGH1 may be a gate-off voltage, e.g., a voltage having a high level.

The sixth transistor M6 is connected between a second input terminal IN2 and the first write scan line SWL1, and has a gate electrode connected to the first node N1. The sixth transistor M6 may electrically connect the second input terminal IN2 and the first write scan line SWL1 to each other according to the voltage of the first node N1.

The first capacitor C1 may be connected between the first node N1 and the first write scan line SWL1. The second capacitor C2 may be connected between the second node N2 and the first power voltage VGH1.

The second transistor M2 is connected between the zeroth carry line CL0 and the stage select node STN, and has a gate electrode connected to a first input terminal IN1. The second transistor M2 may transfer a signal of the zeroth carry line CL0 to the stage select node STN in response to a signal supplied to the first input terminal IN1, e.g., a first clock signal CLK1.

The third transistor M3 and the fourth transistor M4 may be connected in series between the stage select node STN and the first power voltage VGH1. The third transistor M3 is connected between the fourth transistor M4 and the stage select node STN, and has a gate electrode connected to the second input terminal IN2. The third transistor M3 may electrically connect the fourth transistor M4 and the stage select node STN to each other in response to a signal supplied to the second input terminal IN2, e.g., a second clock signal CLK2. The fourth transistor M4 is connected between the third transistor M3 and the first power voltage VGH1, and has a gate electrode connected to the second node N2. The fourth transistor M4 may electrically connect the third transistor M3 and the first power voltage VGH1 to each other in response to the voltage of the second node N2.

The seventh transistor M7 is connected between the second node N2 and the first input terminal IN1, and has a gate electrode connected to the stage select node STN. The seventh transistor M7 may electrically connect the first input terminal IN1 and the second node N2 to each other according to the voltage of the stage select node STN.

The eighth transistor M8 is connected between the second node N2 and the first reference voltage VGL1, and has a gate electrode connected to the first input terminal IN1. The eighth transistor M8 may transfer the first reference voltage VGL1 to the second node N2 according to the signal of the first input terminal IN1, e.g., the first clock signal CLK1.

The compensation scan circuit 420 may include a carry signal generating circuit 421 and an output circuit 422. The carry signal generating circuit 421 may output a carry signal CS to a carry signal output node CON, based on the enabled voltage signal of the stage select node STN. To accomplish this, the carry signal generating circuit 421 may include ninth to eleventh transistors M9 to M11 and a third capacitor C3.

The ninth transistor M9 is connected between the stage select node STN and a third node N3, and has a gate electrode connected to the first reference voltage VGL1. The ninth transistor M9 may be maintained in the turn-on state by the first reference voltage VGL1, thereby electrically connecting the stage select node STN and the third node N3 to each other. Like the first transistor M1, the ninth transistor M9 may limit the width of voltage drop of the stage select node STN according to a voltage of the third node N3.

The tenth transistor M10 is connected between the first power voltage VGH1 and the carry signal output node CON, and has a gate electrode connected to the second node N2. The tenth transistor M10 may electrically connect the first power voltage VGH1 and the carry signal output node CON to each other according to the voltage of the second node N2.

The eleventh transistor M11 is connected between a third input terminal IN3 and the carry signal output node CON, and has a gate electrode connected to the third node N3. The eleventh transistor M11 may transfer, to the carry signal output node CON, a second inverted clock signal nCLK2 supplied to the third input terminal IN3, according to the voltage of the third node N3.

The third capacitor C3 may be connected between the third node N3 and the carry signal output node CON.

A first carry line CL1 branches off from the carry signal output node CON to be connected to a next stage, and therefore, the carry signal CS may be transferred as a stage select signal to the next stage. The first carry line CL1 may be directly connected to the tenth and eleventh transistors M10 and M11 as well as the third capacitor C3.

In some embodiments, the first to eleventh transistors M1 to M11 may be P-type transistors.

The output circuit 422 may output a compensation scan signal to a first compensation scan line SCL1, based on the carry signal CS of the carry signal output node CON. The output circuit 422 may include an inverter circuit having twelfth and thirteenth transistors M12 and M13. The first carry line CL1 may be directly connected to the twelfth and thirteenth transistors M12 and M13. The twelfth transistor M12 may be a P-type transistor. The twelfth transistor M12 is connected between a second power voltage VGH2 and the first compensation scan line SCL1, and has a gate electrode connected to the carry signal output node CON. The thirteenth transistor M13 may be an N-type transistor. The thirteenth transistor M13 is connected between the first compensation scan line SCL1 and a second reference voltage VGL2, and has a gate electrode connected to the carry signal output node CON. Accordingly, the output circuit 422 may output a compensation scan signal to the first compensation scan line SCL1 by inverting the carry signal CS of the carry signal output node CON. The compensation scan signal is the inverted carry signal CS.

Figure 6:
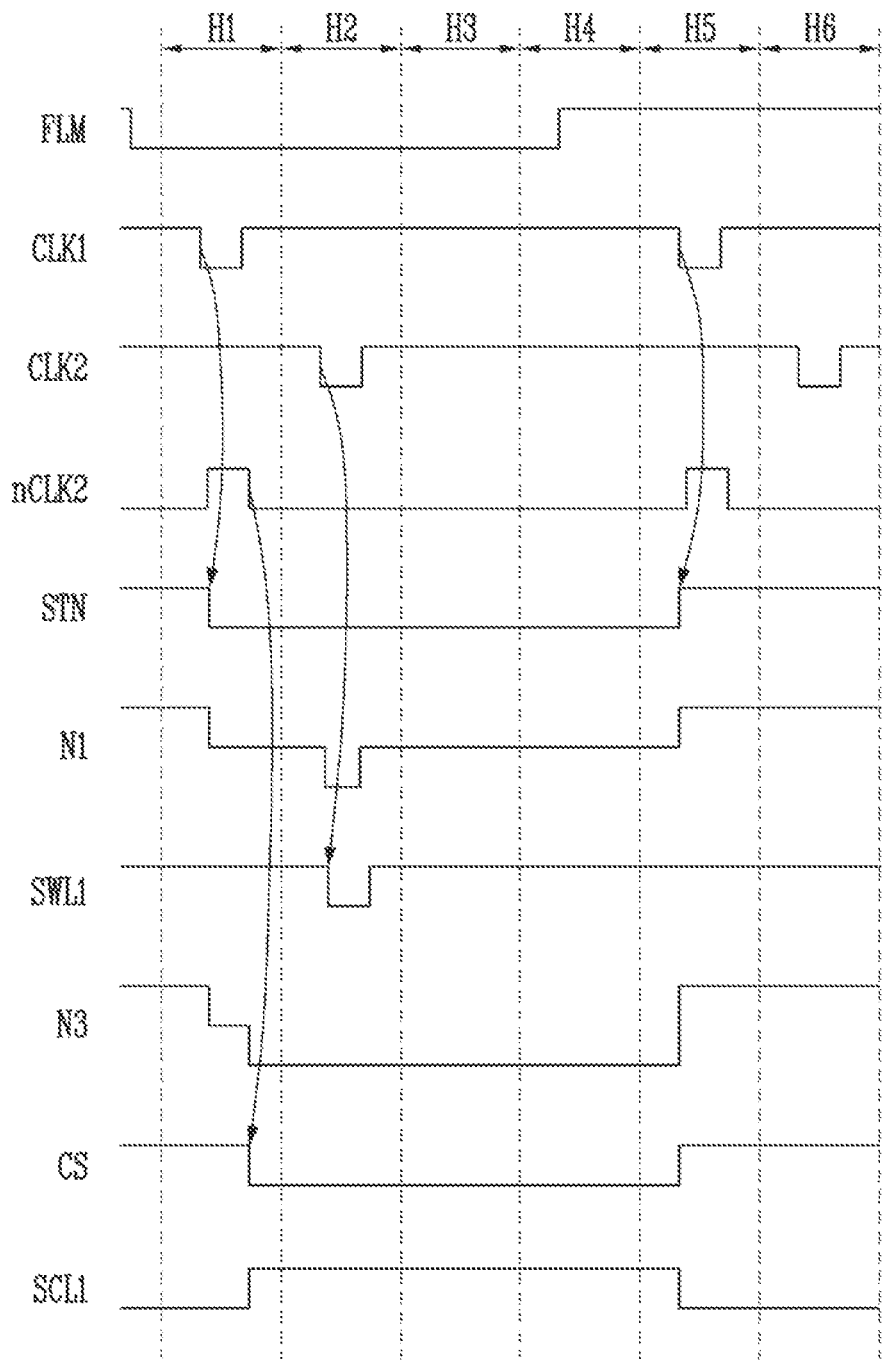
FIG. 6 is a timing diagram illustrating an embodiment of signals associated with the stage shown in FIG. 5 in a plurality of horizontal periods.

FIG. 6 is a timing diagram illustrating an embodiment of signals associated with the stage shown in FIG. 5 in a plurality of horizontal periods.

Referring to FIGS. 5 and 6, in a first horizontal period H1, the start signal FLM has a low level. The start signal FLM may be enabled to the low level in a previous horizontal period, and maintain a state in which the start signal FLM is enabled to the low level in the first horizontal period H1. In addition, the first clock signal CLK1 is enabled to the low level.

The second transistor M2 may be turned on in response to the enabled first clock signal CLK1, and the voltage of the stage select node STN may be enabled to the low level according to the start signal FLM of the zeroth carry line CL0. For example, the voltage of the stage select node STN may have the low level when the first clock signal CLK1 has the low level. The voltage of the first node N1 may also be decreased according to the voltage of the stage select node STN. The voltage of the third node N3 may also be decreased according to the voltage of the stage select node STN.

In the first horizontal period H1, the eighth transistor M8 may be turned on in response to the enabled first clock signal CLK1, so that the first reference voltage VGL1 is transferred to the second node N2. The tenth transistor M10 may be turned on according to the voltage of the second node N2. Accordingly, the first power voltage VGH1 may be transferred to the carry signal output node CON, so that the carry signal CS has a high level. The eleventh transistor M11 may be turned on according to the decreased voltage of the third node N3, so that the third input terminal IN3 and the carry signal output node CON are electrically connected to each other. When the second inverted clock signal nCLK2 changed to the high level is transferred to the carry signal output node CON through the eleventh transistor M11, the first power voltage VGH is transferred to the carry signal output node CON through the tenth transistor M10, and therefore, the carry signal CS may maintain the high level.

The first clock signal CLK1 is again disabled to the high level in the first horizontal period H1. The eighth transistor M8 is turned off, so that the connection between the first reference voltage VGL1 and the second node N2 is blocked. Accordingly, the tenth transistor M10 is turned off, so that the connection between the first power voltage VGH1 and the carry signal output node CON is blocked.

The second inverted clock signal nCLK2 is also changed to the low level in the first horizontal period H1. The eleventh transistor M11 is turned on according to the decreased voltage of the third node N3, and therefore, the voltage of the carry signal CS may be decreased in response to the second inverted clock signal nCLK2 changed to the low level. The voltage of the third node N3 may be further decreased by coupling of the third capacitor C3, and accordingly, the eleventh transistor M11 can be stably turned on. The carry signal CS can be stably enabled to the low level.

The carry signal CS is transferred to the first compensation scan line SCL1 via the output circuit 422. The compensation scan signal enabled to the high level is applied to the first compensation scan line SCL1, since the compensation scan signal is the carry signal CS inverted.

In a second horizontal period H2, the second clock signal CLK2 is toggled to be enabled to the low level and to be again disabled to the high level. The sixth transistor M6 is turned on by the decreased voltage of the first node N1, so that the second input terminal IN2 and the first write scan line SWLi are electrically connected to each other. When the second clock signal CLK2 of the second input terminal IN2 is applied to the first write scan line SWL1, the voltage of the first node N1 is further decreased by the coupling of the first capacitor C1, and accordingly, the sixth transistor M6 can stably maintain the turn-on state. The voltage of the first write scan line SWLi stably reflects the toggle of the second clock signal CLK2. For example, the voltage of the first write scan line SWL1 transitions like the second clock signal CLK2 during the second horizontal period H2. The voltage of the first write scan line SWL1 is output as a write scan signal.

In a fourth horizontal period H4 after a third horizontal period H3, the start signal FLM is disabled to the high level.

In a fifth horizontal period H5, the first clock signal CLK1 is enabled to the low level. Thus, the second transistor M2 is turned on, and the start signal FLM having the high level is transferred to the stage select node STN. Accordingly, the voltage of the stage select node STN is disabled to the high level.

The voltage of the stage select node STN is transferred to the first node N1 and the third node N3. Accordingly, the voltages of the first node N1 and the third node N3 are increased, and the sixth transistor M6 and the eleventh transistor M11 are turned off.

The eighth transistor M8 is turned on in response to the first clock signal CLK1 enabled to the low level, and accordingly, the first reference voltage VGL1 is transferred to the second node N2. The tenth transistor M10 is turned on according to the voltage of the second node N2, and the first power voltage VGH1 is transferred to the carry signal output node CON. Accordingly, the carry signal CS is disabled to the high level.

The carry signal CS is transferred to the first compensation scan line SCL1 via the output circuit 422. The compensation scan signal disabled to the low level is output to the first compensation scan line SCL1 since the compensation scan signal is the carry signal CS inverted.

In a sixth horizontal period H6, the second clock signal CLK2 may be toggled. Since the sixth transistor M6 is turned off as described above, the second clock signal CLK2 is not transferred to the first write scan line SWL1.

Figure 7:
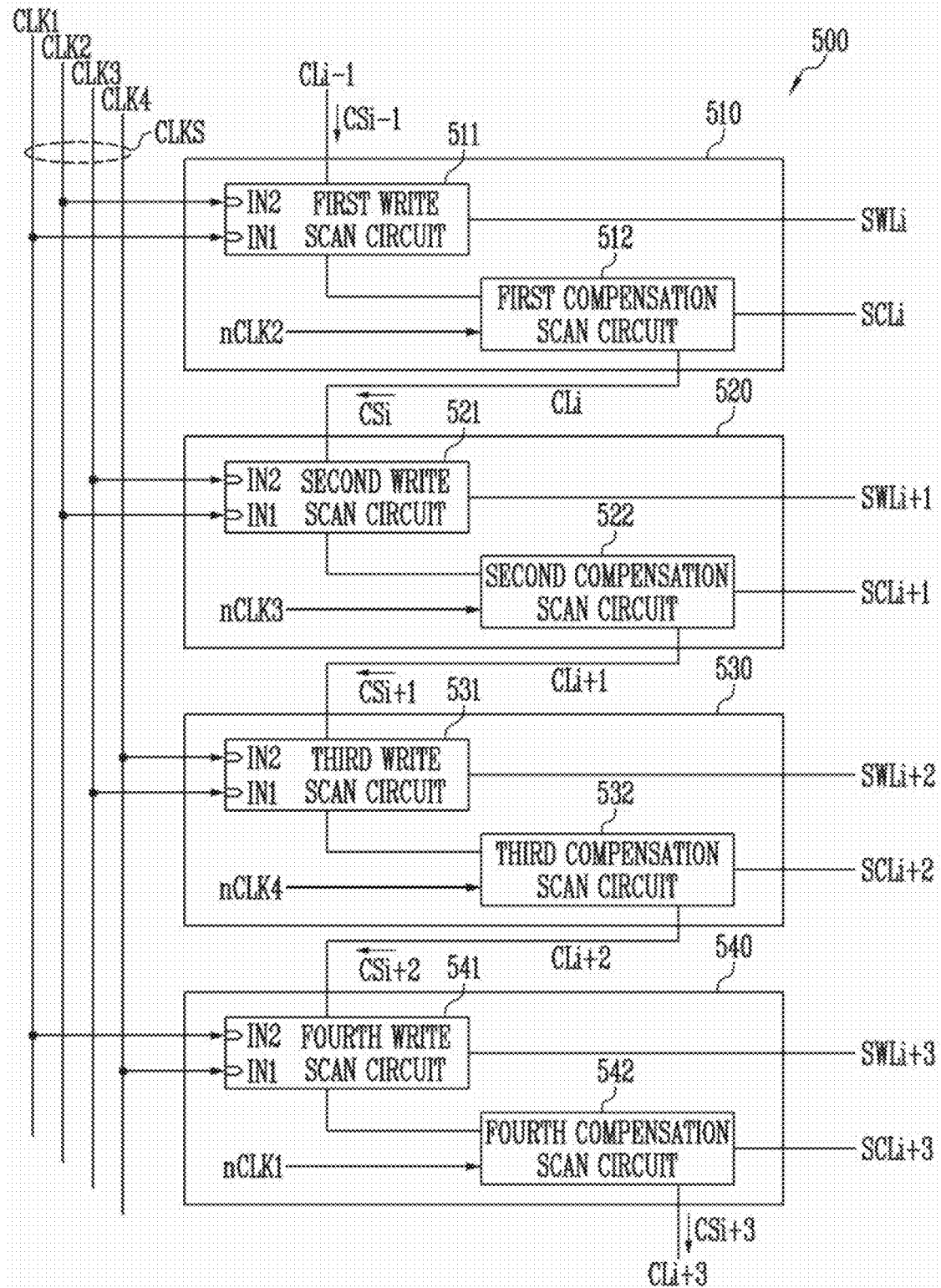
FIG. 7 is a block diagram illustrating an embodiment of some stages among the first to mth stages shown in FIG. 3.

FIG. 7 is a block diagram illustrating an embodiment of some stages among the first to mth stages shown in FIG. 3.

Referring to FIG. 7, first to fourth stages 510 to 540 may receive first to fourth clock signals CLK1 to CLK4 and first to fourth inverted clock signals nCLK1 to nCLK4, and form one stage group 500. The first to fourth clock signals CLK1 to CLK4 may be included in the clock signals CLKS shown in FIG. 3. The first to fourth inverted clock signals nCLK1 to nCLK4 may be included in the inverted clock signals nCLKS shown in FIG. 3. The period of each of the first to fourth clock signals CLK1 to CLK4 and the first to fourth inverted clock signals nCLK1 to nCLK4 may correspond to four horizontal periods, like the first and second clock signals CLK1 and CLK2 and the second inverted clock signal nCLK2, which are shown in FIG. 6.

The stage group 500 may be repeatedly connected. The repeatedly connected stage groups may be included in the scan driver 200 shown in FIG. 3. A plurality of stage groups may form at least some of the first to mth stages 210 to 2m0.

Each of the first to fourth stages 510 to 540 may be configured identically to the stage 300 shown in FIG. 4. Each stage of the first to fourth stages 510 to 540 may receive clock signals and inverted clock signals according to a position thereof in the stage group 500. Each of the first to fourth stages 510 to 540 may sequentially output a write scan signal and a compensation scan signal while sequentially transferring a carry signal.

The first stage 510 may include a first write scan circuit 511 and a first compensation scan circuit 512. The first write scan circuit 511 may receive the first and second clock signals CLK1 and CLK2 through first and second input terminals IN1 and IN2, receive an (i−1)th carry signal CSi−1 through an (i−1)th carry line CLi−1, and output a write scan signal to a first write scan line SWLi. When i is 1, the (i−1)th carry signal CSi−1 may be a start signal FLM. The first compensation scan circuit 512 may receive the second inverted clock signal nCLK2, output a first carry signal CSi through an ith carry line CLi, and output a compensation scan signal to an ith compensation scan line SCLi.

The second stage 520 may include a second write scan circuit 521 and a second compensation scan circuit 522. The second write scan circuit 521 may receive the second and third clock signals CLK2 and CLK3 through first and second input terminal IN1 and IN2, receive the ith carry signal CSi through the ith carry line CLi, and output a write scan signal to an (i+1)th write scan line SWLi+1. The second compensation scan circuit 522 may receive the third inverted clock signal nCLK3, output an (i+1)th carry signal CSi+1 through an (i+1)th carry line CLi+1, and output a compensation scan signal to an (i+1)th compensation scan line SCLi+1.

The third stage 530 may include a third write scan circuit 531 and a third compensation scan circuit 532. The third write scan circuit 531 may receive the third and fourth clock signals CLK3 and CLK4 through first and second input terminals IN1 and IN2, receive the (i+1)th carry signal CSi+1 through the (i+1)th carry line CLi+1, and output a write scan signal to an (i+2)th write scan line SWLi+2. The third compensation scan circuit 532 may receive the fourth inverted clock signal nCLK4, output an (i+2)th carry signal CSi+2 through an (i+2)th carry line CLi+2, and output a compensation scan signal to an (i+2)th compensation scan line SCLi+2.

The fourth stage 540 may include a fourth write scan circuit 541 and a fourth compensation scan circuit 542. The fourth write scan circuit 541 may receive the fourth and first clock signals CLK4 and CLK1 through first and second input terminals IN1 and IN2, receive the (i+2)th carry signal CSi+2 through the (i+2)th carry lie CLi+2, and output a write scan signal to an (i+3)th write scan line SWLi+3. The fourth compensation scan circuit 542 may receive the first inverted clock signal nCLK1, output an (i+3)th carry signal CSi+3 through an (i+3)th carry line CLi+3, and output a compensation scan signal to an (i+3)th compensation scan line SCLi+3.

The (i+3)th carry line CLi+3 may be connected to a first stage of a next stage group.

Figure 8:
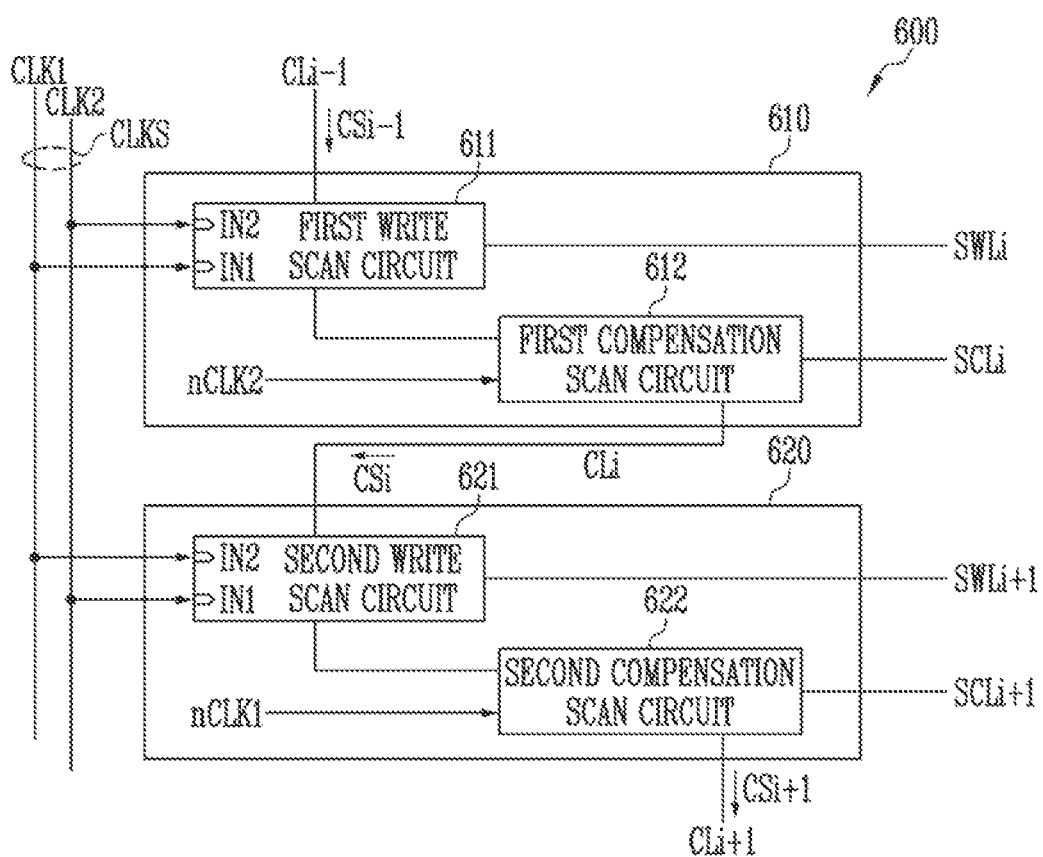
FIG. 8 is a block diagram illustrating another embodiment of the some stages among the first to mth stages shown in FIG. 3.

FIG. 8 is a block diagram illustrating another embodiment of the some stages among the first to mth stages shown in FIG. 3.

Referring to FIG. 8, first and second stages 610 and 620 may receive first and second clock signals CLK1 and CLK2 and first and second inverted clock signals nCLK1 and nCLK2, and form one stage group 600. The first and second clock signals CLK1 and CLK2 may be included in the clock signals CLKS shown in FIG. 3. The first and second inverted clock signals nCLK1 and nCLK2 may be included in the inverted clock signals nCLKS shown in FIG. 3.

The stage group 600 may be repeatedly connected to form at least some of the first to mth stages 210 to 2m0 shown in FIG. 3.

The first stage 610 may include a first write scan circuit 611 and a first compensation scan circuit 612. The first write scan circuit 611 may receive the first and second clock signals CLK1 and CLK2 through first and second input terminals IN1 and IN2, receive an (i−1)th carry signal CSi−1 though an (i−1)th carry line CLi−1, and output a write scan signal to an ith write scan line SWLi. The first compensation scan circuit 612 may receive the second inverted clock signal nCLK2, output an ith carry signal CSi through the ith carry line CLi, and output a compensation scan signal to an ith compensation scan line SCLi.

The second stage 620 may include a second write scan circuit 621 and a second compensation scan circuit 622. The second write scan circuit 621 may receive the second and first clock signals CLK2 and CLK1 through first and second input terminals IN1 and IN2, receive the ith carry signal CSi through the ith carry line CLi, and output a write scan signal to an (i+1)th write scan line SWLi+1. The second compensation scan circuit 622 may receive the first inverted clock signal nCLK1, output an (i+1)th carry signal CSi+1 through an (i+1)th carry line CLi+1, and output a compensation scan signal to an (i+1)th compensation scan line SCLi+1.

In this embodiment, the period of each the first and second clock signals CLK1 and CLK2 and the first and second inverted clock signals nCLK1 and nCLK2 may correspond to two horizontal periods.

Like the stage groups 500 and 600 shown in FIGS. 7 and 8, clock signals and inverted clock signals, which are provided to a write scan circuit and a compensation scan circuit of each stage, may be variously changed in some embodiments. The write scan circuit and the compensation scan circuit of each stage may perform the operations described with reference to FIG. 4 in synchronization with the clock signals and the inverted clock signals, which are received thereby.

Figure 9:
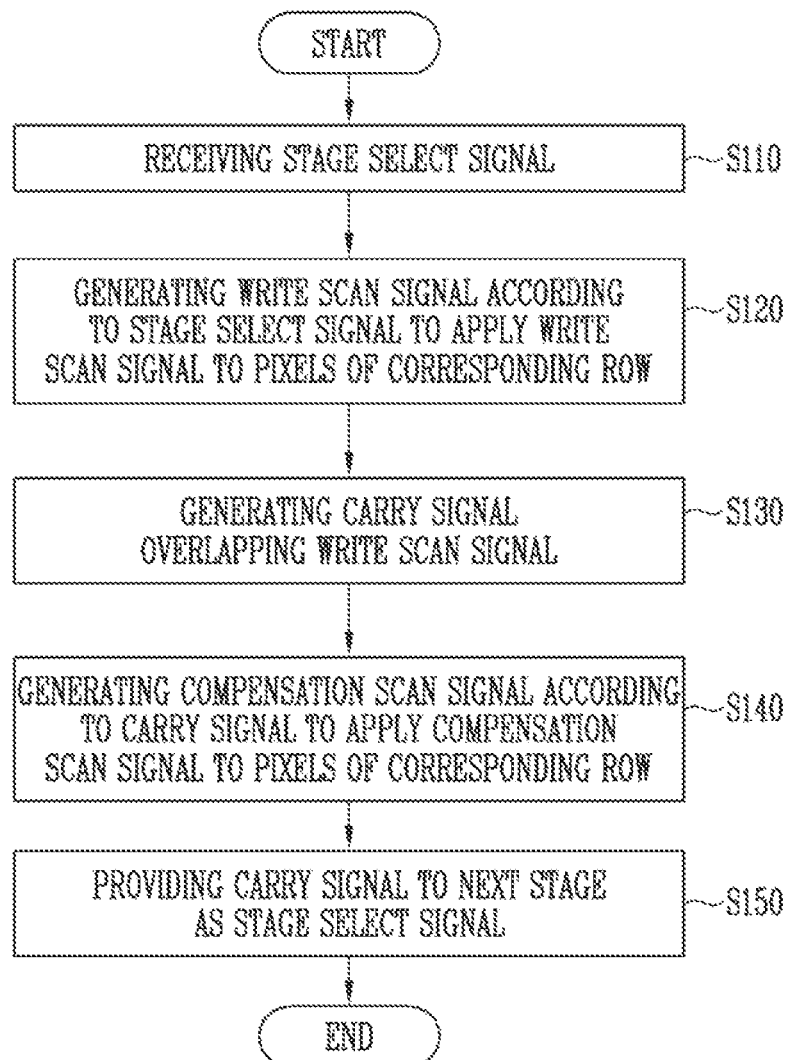
FIG. 9 is a flowchart illustrating an operating method of each stage of the scan driver in accordance with an embodiment of the present disclosure.

FIG. 9 is a flowchart illustrating an operating method of each stage of the scan driver in accordance with an embodiment of the present disclosure. Hereinafter, for convenience of description, it is described that the operating method shown in FIG. 9 is performed by an ith stage among the first to mth stages 210 to 2m0 shown in FIG. 3.

Referring to FIGS. 3 and 9, in step S110, a stage select signal is received at the ith stage. When i is 1, e.g., when the ith stage is the first stage 210, the start signal FLM from the driving controller 120 (see FIG. 1) may be received as the stage select signal. When i is greater than 1, a carry signal from an (i−1)th stage may be received as the stage select signal.

In step S120, a write scan signal is generated according to the stage select signal to apply the write scan signal to pixels of an ith row of the display panel 110 (see FIG. 1). In some embodiments, the write scan signal may be applied to a second transistor T2 (see FIG. 2) of each of the pixels of the ith row.

In step S130, a carry signal temporally overlapping the write scan signal is generated at an internal node (e.g., see the carry signal output node CON shown in FIG. 5) of the ith stage. In step S140, a compensation scan signal is generated according to the carry signal of the internal node of the ith stage to apply the compensation scan signal to the pixels of the ith row. In some embodiments, the compensation scan signal may be applied to a third transistor T3 (see FIG. 2) of each of the pixels of the ith row.

In step S150, the carry signal of the internal node of the ith stage is provided as a stage select signal of a next stage. When i is m, e.g., when the ith stage is the mth stage 2m0, the step S150 may be omitted.

In accordance with the embodiment of the present disclosure, each stage generates a carry signal temporally overlapping with a write scan signal, and generates a compensation scan signal according to the generated carry signal. The carry signal may be transferred as a stage select signal to a next stage. For example, the carry signal is not a signal which branches off from the write scan signal or the compensation scan signal. Accordingly, the carry signal can be stably output to the next stage while not being influenced by loads (see the first and second loads L1 and L2 shown in FIG. 4) corresponding to pixel circuits of a corresponding row. For example, the carry signal may have a relatively short transition time. Thus, the carry signal can have increased reliability. Consequently, the operating method of the scan driver 200 can provide increased reliability.

Figure 10:
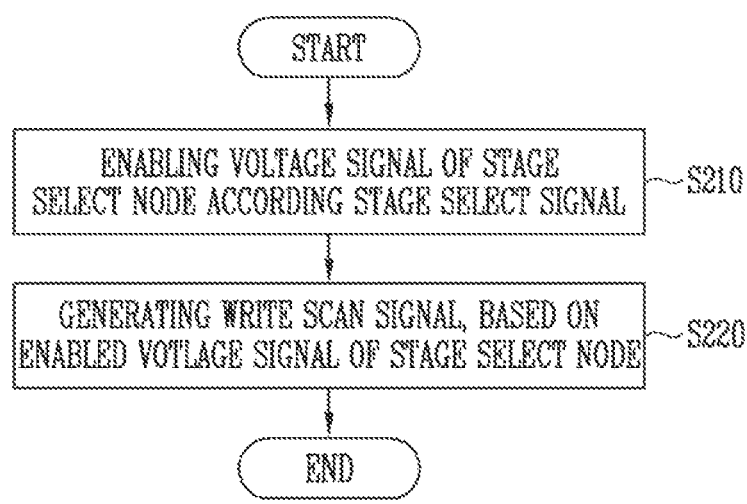
FIG. 10 is a flowchart illustrating an embodiment of step S120 shown in FIG. 9.

FIG. 10 is a flowchart illustrating an embodiment of the step S120 shown in FIG. 9.

In step S210, the stage select signal is transferred to a stage select node (see STN shown in FIG. 5) in the ith stage, to enable a voltage signal of the stage select node. In step S220, a write scan signal is generated based on the enabled voltage signal of the stage select node.

Figure 11:
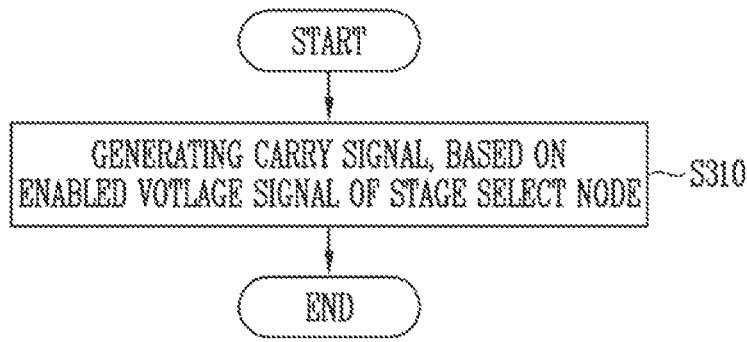
FIG. 11 is a flowchart illustrating an embodiment of step S130 shown in FIG. 9.

FIG. 11 is a flowchart illustrating an embodiment of the step S130 shown in FIG. 9.

In step S310, a carry signal is generated based on the enabled voltage signal of the stage select node (see the stage select node STN shown in FIG. 5) in the ith stage.

As described above, since the write scan signal and the carry signal are generated based on the enabled voltage signal of the stage select node, the write scan signal and the carry signal can temporally overlap with each other.

In accordance with embodiments of the present disclosure, there is provided a scan driver for driving pixels with increased reliability, a display device including the scan driver, and a method for driving pixels. For example, the scan driver enables a carry signal sequentially transferred to each stage not to be influenced by a load (or capacitance) of each pixel row, and accordingly, the carry signal can have a decreased transition time. Thus, the scan driver can provide the carry signal with increased reliability.

In some instances, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Accordingly, it will be understood by those of ordinary skill in the art that various changes in form and details may be made thereto without departing from the spirit and scope of the present disclosure as set forth in the following claims.

What is claimed is:

1. A scan driver for driving a plurality of pixels, the scan driver comprising:
   stages connected to each other through carry lines,
   wherein a first stage among the stages includes:
   a first scan circuit configured to generate a first scan signal in response to a stage select signal, and apply the first scan signal to pixels of the same row among the plurality of pixels, and
   a second scan circuit electrically connected to the first scan circuit to generate a carry signal overlapping the first scan signal, and configured to provide a second scan signal to the pixels of the same row in response to the carry signal,
   wherein the carry signal is output as the stage select signal to a second stage among the stages through one of the carry lines, and
   wherein the second scan circuit generates the second scan signal by inverting the carry signal.

2. The scan driver of claim 1, wherein the first scan circuit and the second scan circuit are connected to each other through a first connection node,
   wherein the first scan circuit is configured to enable a voltage signal of the first connection node in response to the stage select signal, and to generate the first scan signal based on the enabled voltage signal of the first connection node, and
   wherein the second scan circuit includes a carry signal generating circuit configured to generate the carry signal, based on the enable voltage signal of the first connection node.

3. The scan driver of claim 2, wherein the second scan circuit further includes an output circuit configured to generate the second scan signal by receiving the carry signal through a second connection node,
   wherein the one of the carry lines is connected to the second stage, and wherein the one of the carry lines is connected to the second connection node.

4. The scan driver of claim 1, wherein each of the plurality of pixels includes a P-type transistor and an N-type transistor, and
   wherein the first scan signal is applied to P-type transistors of the pixels of the same row, and
   the second scan signal is applied to N-type transistors of the pixels of the same row.

5. A display device comprising:
   pixels; and
   a scan driver configured to drive the pixels,
   wherein the scan driver includes stages respectively driving rows of the pixels, the stages being connected to each other through carry lines,
   wherein an ith stage among the stages includes:
   a first scan circuit configured to generate a first scan signal in response to a stage select signal, and apply the first scan signal to pixels of a row corresponding to the ith stage; and
   a second scan circuit electrically connected to the first scan circuit to generate a carry signal overlapping the first scan signal, and configured to provide a second scan signal to the pixels of the row corresponding to the ith stage in response to the carry signal,
   wherein the i is an integer greater than or equal to 1,
   wherein the carry signal is output as the stage select signal to an (i+1)th stage among the stages through one of the carry lines, and
   wherein the second scan circuit generates the second scan signal by inverting the carry signal.

6. The display device of claim 5, further comprising a data driver configured to drive the pixels,
   wherein each of the pixels includes:
   a first transistor to be turned on in response to the first scan signal to receive a data signal from the data driver;
   a storage capacitor to be charged by receiving the data signal through a first node; and
   a second transistor connected to the first node, the second transistor configured to be turned on in response to the second scan signal.

7. The display device of claim 6, wherein each of the pixels further includes a third transistor configured to transfer the data signal received through the first transistor to a second node in response to a voltage of the first node, and
   wherein the second transistor is connected between the first node and the second node, and is configured to be turned on in response to the second scan signal to transfer the data signal to the first node.

8. The display device of claim 7, wherein the first and third transistors include P-type transistors, and
   the second transistor includes an N-type transistor.

9. The display device of claim 7, wherein each of the pixels further includes a light emitting diode electrically connected to the second node.

10. The display device of claim 5, further comprising a driving controller configured to control the scan driver,
    wherein the stages include first to mth stages sequentially connected through the carry lines, and
    wherein, when the ith stage is the first stage, the ith stage is configured to receive a start signal as the stage select signal from the driving controller.

11. The display device of claim 5, further comprising a driving controller configured to control the scan driver,
    wherein the driving controller is configured to generate first clock signals and second clock signals, and
    wherein the first scan circuit is configured to be operated in response to at least one of the first clock signals, and
    the second scan circuit is configured to be operated in response to at least one of the second clock signals.

12. The display device of claim 5, wherein the first scan circuit and the second scan circuit are connected to each other through a first connection node,
    wherein the first scan circuit is configured to enable a voltage signal of the first connection node in response to the stage select signal, and to generate the first scan signal, based on the enabled voltage signal of the first connection node, and
    wherein the second scan circuit includes a carry signal generating circuit configured to generate the carry signal, based on the enabled voltage signal of the first connection node.

13. The display device of claim 12, wherein the second scan circuit further includes an output circuit configured to generate the second scan signal by receiving the carry signal through a second connection node, wherein the one of the carry lines is connected between the (i+1)th stage and the second connection node.

14. A method for driving a plurality of pixels, wherein rows of the plurality of pixels are respectively connected to stages, and the stages are connected to each other, and wherein the method comprises: in any one of the stages, receiving a stage select signal;

generating a first scan signal in response to the stage select signal and applying the first scan signal to pixels of the same row among the plurality of pixels;

generating a carry signal overlapping the first scan signal;

generating a second scan signal in response to the carry signal and applying the second scan signal to the pixels of the same row; and providing the carry signal as the stage select signal to another of the stages, wherein the applying of the second scan signal includes generating the second scan signal by inverting the carry signal.

15. The method of claim 14, wherein the applying of the first scan signal includes:

generating an enabled voltage signal at an internal node in response to the stage select signal; and generating a first scan signal, based on the enabled voltage signal, and wherein the generating of the carry signal includes generating the carry signal, based on the enabled voltage signal.

16. A scan driver for driving a plurality of pixels, the scan driver comprising:

a first scan circuit configured to generate a first scan signal in response to a stage select signal; and a second scan circuit connected to the first scan circuit and configured to generate a carry signal and generate a second scan signal in response to the carry signal, wherein the carry signal is output to a next stage from a node located at an input of an output part of the second scan circuit, and wherein the second scan circuit generates the second scan signal by inverting the carry signal.

17. The scan driver of claim 16, wherein the first scan signal and the carry signal overlap.

* * * * *